US010402318B2

(12) United States Patent
Lee et al.

(10) Patent No.: US 10,402,318 B2
(45) Date of Patent: Sep. 3, 2019

(54) MAPPING TABLE UPDATING METHOD, MEMORY CONTROL CIRCUIT UNIT AND MEMORY STORAGE DEVICE

(71) Applicant: Hefei Core Storage Electronic Limited, Anhui Province (CN)

(72) Inventors: Hao-Zhi Lee, Miaoli (TW); Qi-Ao Zhu, Anhui Province (CN); Chong Peng, Anhui Province (CN)

(73) Assignee: Hefei Core Storage Electronic Limited, Anhui Province (CN)

( * ) Notice: Subject to any disclaimer, the term of this patent is extended or adjusted under 35 U.S.C. 154(b) by 0 days.

(21) Appl. No.: 15/853,868

(22) Filed: Dec. 25, 2017

(65) Prior Publication Data
US 2019/0138445 A1    May 9, 2019

(30) Foreign Application Priority Data

Nov. 3, 2017    (CN) .......................... 2017 1 1068067

(51) Int. Cl.
| G06F 12/06 | (2006.01) |
| G06F 12/02 | (2006.01) |
| G11C 16/14 | (2006.01) |
| G11C 16/08 | (2006.01) |

(52) U.S. Cl.
CPC ........ G06F 12/063 (2013.01); G06F 12/0246 (2013.01); G06F 12/0292 (2013.01); G11C 16/14 (2013.01); G11C 16/08 (2013.01)

(58) Field of Classification Search
CPC .. G06F 3/063; G06F 12/0246; G06F 12/0292; G06F 12/063
See application file for complete search history.

(56) References Cited

U.S. PATENT DOCUMENTS

| 2004/0065744 | A1* | 4/2004 | Shiraishi ............ G11C 16/3418 235/492 |
| 2013/0198439 | A1* | 8/2013 | Kurotsuchi ......... G06F 12/0246 711/103 |
| 2017/0017570 | A1* | 1/2017 | Yeh ..................... G06F 12/0246 |
| 2017/0131951 | A1* | 5/2017 | Miura .................... G06F 12/16 |

FOREIGN PATENT DOCUMENTS

TW    I534618    5/2016

OTHER PUBLICATIONS

Office Action of Taiwan Counterpart Application, dated Jun. 28, 2018, pp. 1-6.

* cited by examiner

Primary Examiner — Than Nguyen
(74) Attorney, Agent, or Firm — JCIPRNET

(57) ABSTRACT

A mapping table updating method, a memory control circuit unit and a memory storage device. The method includes: receiving a first data corresponding to a first logical address from a host system; loading a first logical address-physical address mapping table according to the first logical address; sending a command sequence to a rewritable non-volatile memory module; in the process of writing the first data into a first physical programming unit according to the command sequence by a control circuit of the rewritable non-volatile memory module, updating the first logical address-physical address mapping table; and after writing the first data into the first physical programming unit by the control circuit, storing the updated first logical address-physical address table back to the rewritable non-volatile memory module.

18 Claims, 9 Drawing Sheets

MAPPING TABLE UPDATING METHOD, MEMORY CONTROL CIRCUIT UNIT AND MEMORY STORAGE DEVICE

CROSS-REFERENCE TO RELATED APPLICATION

This application claims the priority benefit of China application serial no. 201711068067.9, filed on Nov. 3, 2017. The entirety of the above-mentioned patent application is hereby incorporated by reference herein and made a part of this specification.

BACKGROUND OF THE INVENTION

Field of the Invention

The invention is related to a mapping table updating method, a memory control circuit unit and a memory storage device.

Description of Related Art

The development of digital cameras, mobile phones and MP3 has grown rapidly in recent years, and thus consumers' demand for storage media is also increasing. Since rewritable non-volatile memory is characterized in data non-volatility, power saving, small volume, non-mechanical structure, fast reading and writing speed, it is highly suitable for being used in portable electronic products such as notebook computer. A solid-state disk is a memory storage device that uses a flash memory as a storage media. Therefore, in recent years, flash memory industry has become popular among electronic industries.

Flash memory module has a plurality of physical erasing units, and each of the physical erasing units has a plurality of physical programming units, wherein it is required to write data in the sequence of the physical programming units in the processing of writing data into the physical erasing unit. In addition, the physical programming units that have been written with data needs to be erased to be written with data again. In particular, the physical erasing unit is the minimum unit for erasing operation, and the physical programming unit is the minimum unit for programming (also referred to as writing operation) operation. Therefore, in the management of flash memory module, the physical erasing unit is divided into a data area and a free area.

The physical erasing unit in the data area stores data stored by a host system. Specifically, a memory management circuit in the memory storage device converts a logical access address accessed by the host system into a logical page of a logical block, and maps the logical page of the logical block to a physical programming unit of the physical erasing unit in the data area. That is to say, in the management of flash memory module, the physical erasing unit in the data area is regarded as a used physical erasing unit (e.g., which has stored the data written by host system). For example, the memory management circuit uses a logical address-physical address mapping table to record a mapping relationship between the logical page and the physical programming units in the data area.

However, in a conventional method of updating mapping information in a logical address-physical address mapping table, generally three steps are carried out in sequence: loading the logical address-physical address mapping table; updating the mapping information in the logical address-physical address mapping table; and storing the updated logical address-physical address mapping table back to the rewritable non-volatile memory module.

However, in the processing of updating the mapping information of the logical address-physical address mapping table, since the memory management circuit is updating the mapping information in the logical address-physical address mapping table, generally the rewritable non-volatile memory module does not receive a command sequence given by the memory management circuit. That is to say, in the process of updating the mapping information in the logical address-physical address mapping table, a control circuit of the rewritable non-volatile memory module is in an idle state, which consequently causes that the utility of the rewritable non-volatile memory module is low in the process of updating the mapping information in the logical address-physical address mapping table.

SUMMARY OF THE INVENTION

The invention provides a mapping table updating method, a memory control circuit unit and a memory storage device, which are capable of effectively improving utility of a rewritable non-volatile memory module, thereby increasing performance of the rewritable non-volatile memory module in writing operation.

The invention provides a mapping table updating method, adapted to a rewritable non-volatile memory module, wherein the rewritable non-volatile memory module has a plurality of physical erasing units. Each of the plurality of physical erasing units has a plurality of physical programming units. The plurality of logical address-physical address mapping tables are stored in the rewritable non-volatile memory module to record mapping information between a plurality of logical addresses and the plurality of physical programming units. The method includes: receiving a first write command corresponding to a first data from a host system, wherein the first data corresponds to a first logical address in the plurality of logical addresses; loading a first logical address-physical address mapping table in the plurality of logical address-physical address mapping tables from the rewriteable non-volatile memory module to a buffer memory according to the first logical address; sending a command sequence to the rewritable non-volatile memory module to instruct a control circuit of the rewritable non-volatile memory module to write the first data to a first physical programming unit in the plurality of physical programming units; in the processing of writing the first data into the first physical programming unit by the control unit of the rewritable non-volatile memory module, updating the first logical address-physical address mapping table temporarily stored in the buffer memory according to the first logical address and the first physical programming unit; and after writing the first data into the first physical programming unit by the control unit of the rewritable non-volatile memory module, storing the updated first logical address-physical address mapping table from the buffer memory back to the rewritable non-volatile memory module.

The invention provides a memory control circuit unit, configured to control a rewritable non-volatile memory module, wherein the rewritable non-volatile memory module has a plurality of physical erasing units. Each of the plurality of physical erasing units has a plurality of physical programming units. A plurality of logical address-physical address mapping tables are stored in the rewritable non-volatile memory module to record mapping information between a plurality of logical addresses and the plurality of physical programming units. The memory control circuit unit includes a host interface, a memory interface and a memory management circuit. The host interface is coupled to a host system. The memory interface is coupled to the rewritable non-volatile memory module. The memory management circuit is coupled to the host interface and the memory interface. The memory management circuit is configured to perform the following operations: receiving a first write command corresponding to a first data from the host system, wherein the first data corresponds to a first logical address in the plurality of logical addresses; loading a first logical address-physical address mapping table in the plurality of logical address-physical address mapping tables from the rewritable non-volatile memory module to a buffer memory according to the first logical address; sending a command sequence to the rewritable non-volatile memory module to instruct a control circuit of the rewritable non-volatile memory module to write the first data to the first physical programming unit in the plurality of physical programming units; in the process of writing the first data to the first physical programming unit by the control circuit of the rewritable non-volatile memory module, updating the first logical address-physical address mapping table temporarily stored in the buffer memory according to the first logical address and the first physical programming unit; and after the first data is written into the first physical programming unit by the control circuit of the rewritable non-volatile memory module, storing the updated first logical address-physical address mapping table from the buffer memory back to the rewritable non-volatile memory module.

The invention provides a memory storage device. The memory storage device includes a connection interface unit, a rewritable non-volatile memory module and a memory control circuit unit. The connection interface unit is coupled to the host system. The rewritable non-volatile memory module has a plurality of physical erasing units. Each of the plurality of physical erasing units has a plurality of physical programming units. A plurality of logical address-physical address mapping tables are stored in the rewritable non-volatile memory module to record mapping information between a plurality of logical addresses and the plurality of physical programming units. The memory control circuit unit is coupled to the connection interface unit and the rewritable non-volatile memory module. The memory control circuit unit is configured to perform the following operations: receiving a first write command corresponding to a first data from the host system, wherein the first data corresponds to a first logical address of the plurality of logical addresses; loading a first logical address-physical address mapping table of the plurality of logical address-physical address mapping tables from the rewritable non-volatile memory module to a buffer memory according to the first logical address; sending a command sequence to the rewritable non-volatile memory module to instruct a control circuit of the rewritable non-volatile memory module to write the first data to a first physical programming unit of the plurality of physical programming units; in the process of writing the first data to the first physical programming unit by the control circuit of the rewritable non-volatile memory module, updating the first logical address-physical address mapping table temporarily stored in the buffer memory according to the first logical address and the first physical programming unit; and after writing the first data to the first physical programming unit by the control circuit of the rewritable non-volatile memory module, storing the updated first logical address-physical address mapping table from the buffer memory back to the rewritable non-volatile memory module.

In summary, according to the invention, the mapping table updating method, the memory control circuit unit and the memory storage device can pre-load the logical address-physical address mapping table to the buffer memory and, when the control circuit of the rewritable non-volatile memory module writes data into a physical programming unit, update the logical address-physical address mapping table temporarily stored in the buffer memory. In other words, the mapping table updating method of the invention allows the memory management circuit and the control circuit of the rewritable non-volatile memory module to operate in parallel, and thus it can be avoided that the control circuit of the rewritable non-volatile memory module is an idle state in the process that the memory management circuit updates the mapping information of the logical address-physical address mapping table. Accordingly, the mapping table updating method of the invention can effectively improve utility of the rewritable non-volatile memory module, thereby increasing performance of the rewritable non-volatile memory module in writing operation.

In order to make the aforementioned features and advantages of the disclosure more comprehensible, embodiments accompanying figures are described in detail below.

DESCRIPTION OF EMBODIMENTS

Generally speaking, a memory storage device (also referred to as memory storage system) includes a rewritable non-volatile memory module and a controller (also referred to as control circuit). Generally, the memory storage device and a host system are used together so that the host system can write data to the memory storage device or read data from the memory storage device.

Figure 1:
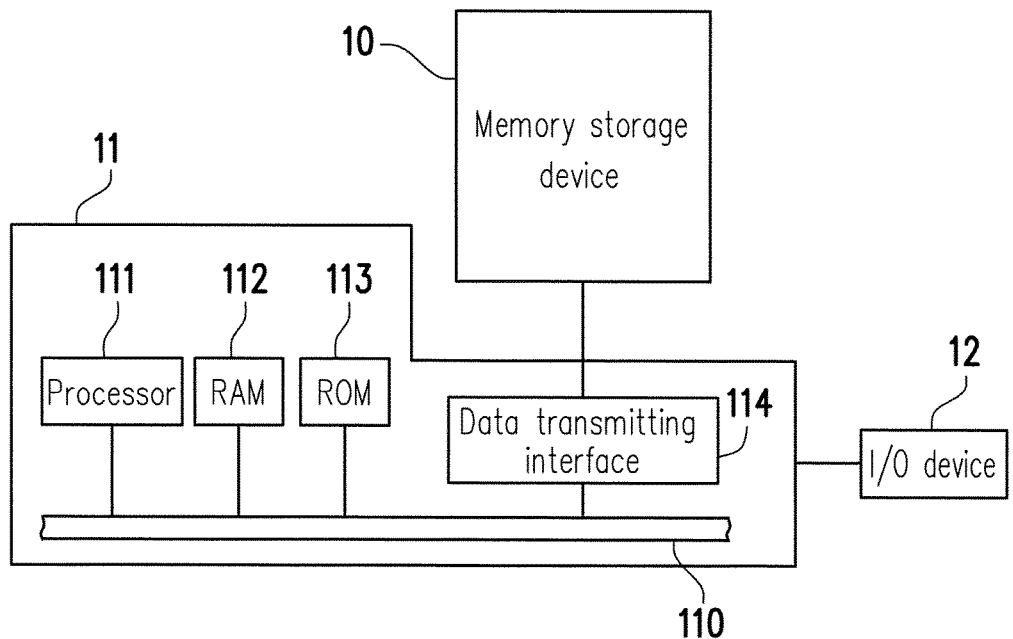
FIG. 1 is a schematic view of a host system, a memory storage device and an input/output (I/O) device according to an exemplary embodiment of the invention.
Figure 2:
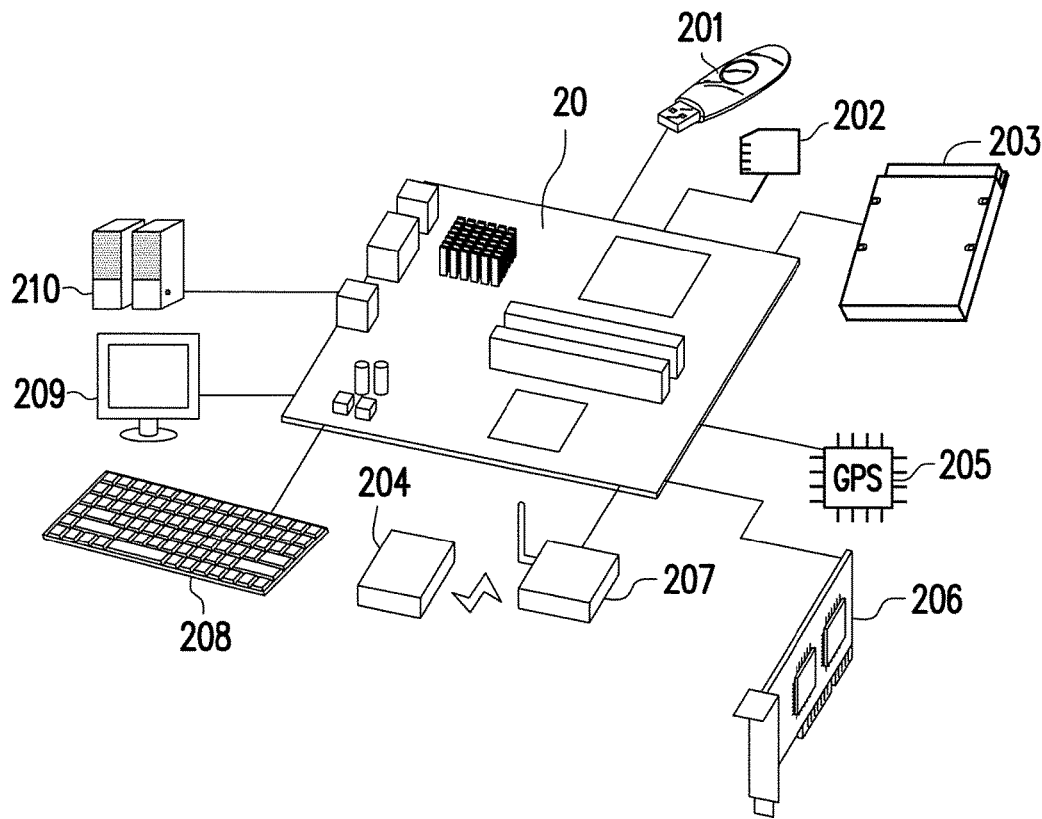
FIG. 2 is a schematic view of a host system, a memory storage device and an I/O device according to another exemplary embodiment of the invention.

FIG. 1 is a schematic view of a host system, a memory storage device and an input/output (I/O) device according to an exemplary embodiment of the invention. FIG. 2 is a schematic view of a host system, a memory storage device and an I/O device according to another exemplary embodiment of the invention.

Referring to FIG. 1 and FIG. 2, generally a host system 11 includes a processor 111, a random access memory (RAM) 112, a read only memory (ROM) 113 and a data transmitting interface 114. The processor 111, the RAM 112, the ROM 113 and the data transmitting interface 114 are all coupled to a system bus 110.

In the exemplary embodiment, the host system 11 is coupled to the memory storage device 10 via the data transmitting interface 114. For example, the host system 11 may store data to the memory storage device 10 via the data transmitting interface 114 or read data from the memory storage device 10. In addition, the host system 11 is coupled to the I/O device 12 via the system bus 110. For example, the host system 11 may transmit an output signal to the I/O device 12 or receive an input signal from the I/O device 12 via the system bus 110.

In the exemplary embodiment, the processor 111, the RAM 112, the ROM 113 and the data transmitting interface 114 may be disposed on a motherboard 20 of the host system 11. The number of the data transmitting interface 114 may be one or more. With the data transmitting interface 114, the motherboard 20 can be coupled to the memory storage device 10 in a wired or wireless manner. The memory storage device 10 may be, for example, a flash drive 201, a memory card 202, a solid state drive (SSD) 203 or a wireless memory storage device 204. The wireless memory storage devices 204 may be a memory storage device that uses various wireless communication technologies as basis such as a near field communication (NFC) memory storage device, a WiFi memory storage devices, a Bluetooth memory storage device or a low-energy Bluetooth memory storage device (e.g., iBeacon). Moreover, the motherboard 20 may be coupled to various I/O device such as a global positioning system (GPS) module 205, a network interface card 206, a wireless transmitting device 207, a keyboard 208, a screen 209, a speaker 210 and so on via the system bus 110. For example, in an exemplary embodiment, the motherboard 20 may access the wireless memory storage device 204 via the wireless transmitting device 207.

Figure 3:
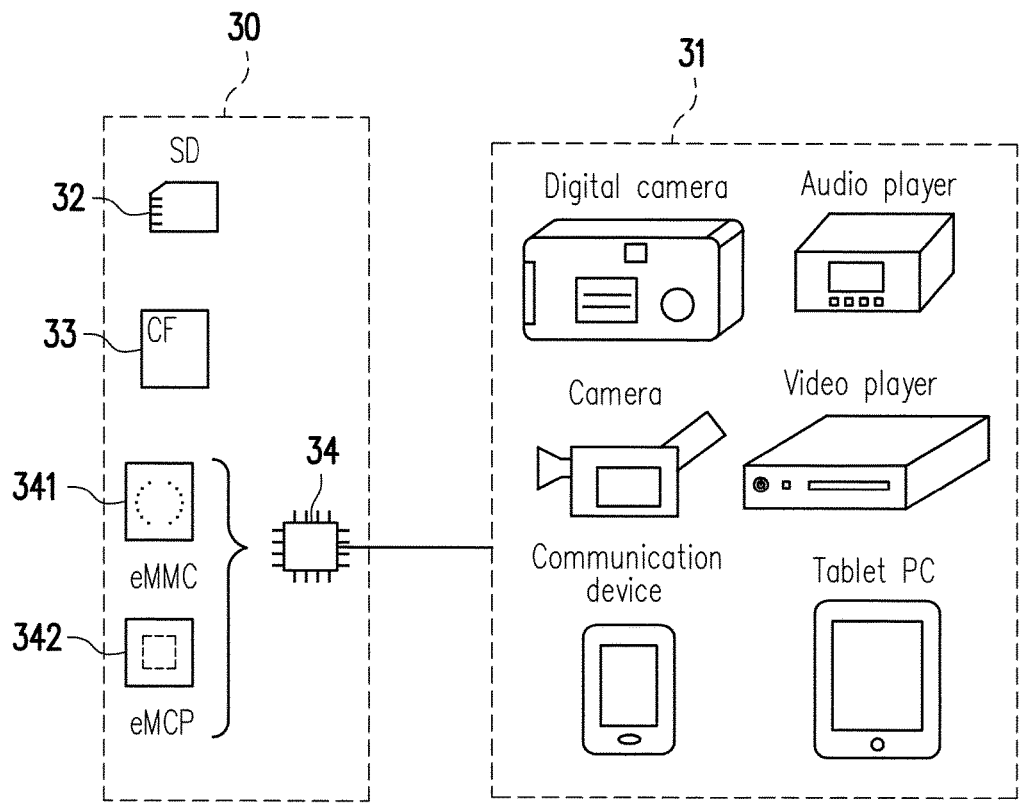
FIG. 3 is a schematic view of a host system and a memory storage device according to another exemplary embodiment of the invention.

In an exemplary embodiment, the host system is any system that can substantially cooperate with the memory storage device to store data. In the above-mentioned exemplary embodiment, although the host system is exemplified as a computer system, FIG. 3 is a schematic view of a host system and a memory storage device according to another exemplary embodiment of the invention. Referring to FIG. 3, in another exemplary embodiment, a host system 31 may be a digital camera, a camera, a communication device, an audio player, a video player or a tablet PC. The memory storage device 30 may be various non-volatile memory storage devices such as an SD card 32, a CF card 33 or an embedded storage device 34. The embedded storage device 34 includes various embedded storage devices such as an embedded MMC (eMMC) 341 and/or an embedded multi chip package (eMCP) 342 that directly couple the memory module to a substrate of the host system.

Figure 4:
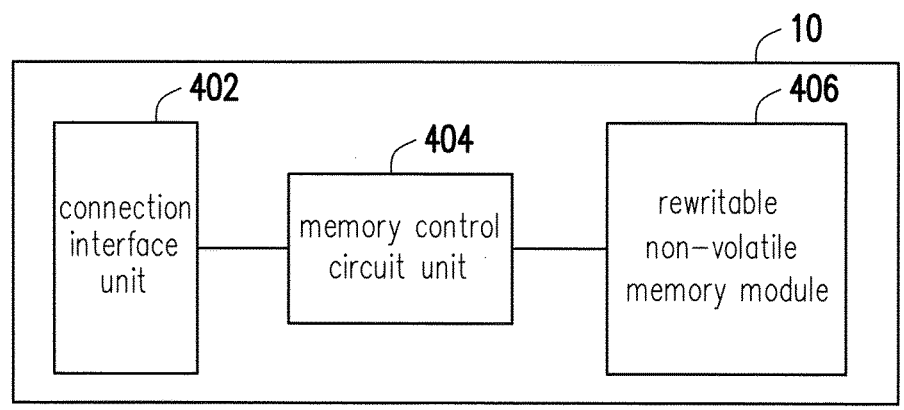
FIG. 4 is a block diagram of a memory storage device according to an exemplary embodiment of the invention.

FIG. 4 is a block diagram of a memory storage device according to an exemplary embodiment of the invention.

Referring to FIG. 4, the memory storage device 10 includes a connection interface unit 402, a memory control circuit unit 404 and a rewritable non-volatile memory module 406.

In the exemplary embodiment, the connection interface unit 402 is compatible with serial advanced technology attachment (SATA) standard; however, it should be understood that the invention is not limited thereto. The connection interface unit 402 may also be compatible with Parallel Advanced Technology Attachment (PATA) standard, Institute of Electrical and Electronic Engines (IEEE) 1394 standard, Peripheral Component Interconnect Express (PCI Express) standard, Universal Serial Bus (USB) standard, Secure Digital (SD) interface standard, Ultra High Speed-I (UHS-I) interface standard, Ultra High Speed-II (UHS-II) interface standard, Memory Stick (MS) interface standard, Multi-Chip Package interface standard, Multi Media Card (MMC) interface standard, Embedded Multimedia Card (eMMC) interface standard, Universal Flash Storage (UFS) interface standard, embedded Multi Chip Package (eMCP) interface standard, Compact Flash (CF) interface standard, Integrated Device Electronics (IDE) interface standard or other suitable standard. The connection interface unit 402 and the memory control circuit unit 404 may be packed together in a chip, or the connection interface unit 402 is arranged outside a chip that includes the memory control circuit unit 404.

The memory control circuit unit 404 is configured to execute a plurality of logical gates realized in the form of hardware or firmware or a control command, and write, read and erase data in a rewritable non-volatile memory module 406 according to a command of the host system 11.

The rewritable non-volatile memory module 406 is coupled to the memory control circuit unit 404 and stores the data written by the host system 11. The rewritable non-volatile memory module 406 has a plurality of physical erasing units. For example, the plurality of physical erasing units may belong to the same memory die or different memory die. Each of the physical erasing units respectively has a plurality of physical programming units, wherein the physical programming units belonging to the same physical erasing unit may be independently written and erased simultaneously; however, it should be understood that the invention is not limited thereto. Each of the physical erasing units may be constructed by 64 physical programming units, 256 physical programming units or a random number of physical programming units.

More specifically, the physical erasing unit is the minimum unit for erasing operation. In other words, each of the physical erasing units has the smallest number of memory cell that is erased altogether. The physical programming unit is the minimum unit for programming operation. In other words, the physical programming unit is the minimum unit for data writing operation. Generally, each of the physical programming units includes a data bit area and a redundant bit area. The data bit area includes a plurality of physical access addresses that store user's data, and the redundant bit area stores data (e.g., control information and error correction code) of the system. In the exemplary embodiment, the data bit area of each of the physical programming units includes four physical access addresses, and the size of one physical access address is 512 byte. However, in other exemplary embodiment, the data bit area may include more or less number of physical access address; the invention provides no limitation to the size and number of the physical access address. For example, in an exemplary embodiment, the physical erasing unit is a physical block, and the physical programming unit is a physical page or a physical sector, which should not be construed as a limitation to the invention.

In the exemplary embodiment, the rewritable non-volatile memory module 406 is a multi level cell (MLC) NAND type flash memory module (i.e., a flash memory module in which one memory cell can store a data of two bits); however, the invention is not limited thereto. The rewritable non-volatile memory module 406 may be a single level cell (SLC) NAND type flash memory module (i.e., a flash memory module in which one memory cell can store a data of one bit), a trinary level cell (TLC) NAND type flash memory module (i.e., a flash memory module in which one memory cell can store a data of three bits), other flash memory module or other memory module having the same characteristics.

Each of the memory cells in the rewritable non-volatile memory module 406 stores one or more bits according to the change of voltage (e.g., threshold voltage). When a write command sequence or a read command sequence is received from the memory control circuit unit 404, a control circuit (not shown) of the rewritable non-volatile memory module 406 controls a voltage applied to a word line and a bit line (or bit line set) to change the threshold voltage of at least one memory cell or detect a storage state of the memory cell. For example, a charge trapping layer is disposed between a control gate of each of the memory cells and a channel. By applying a write voltage (or program voltage) to the control gate of a memory cell, the electron of the charge trapping layer thereof can be changed, and thus and threshold voltage of the memory cell is changed. The process of changing threshold voltage is also referred to as "writing data into memory cell" or "programming memory cell". With the change of the threshold voltage, the memory cell in the rewritable non-volatile memory module 406 may have a plurality of storage states. By applying read voltage, it can be determined which memory cell belongs to which storage state, thereby obtaining one or more bits stored by the memory cell.

Figure 5:
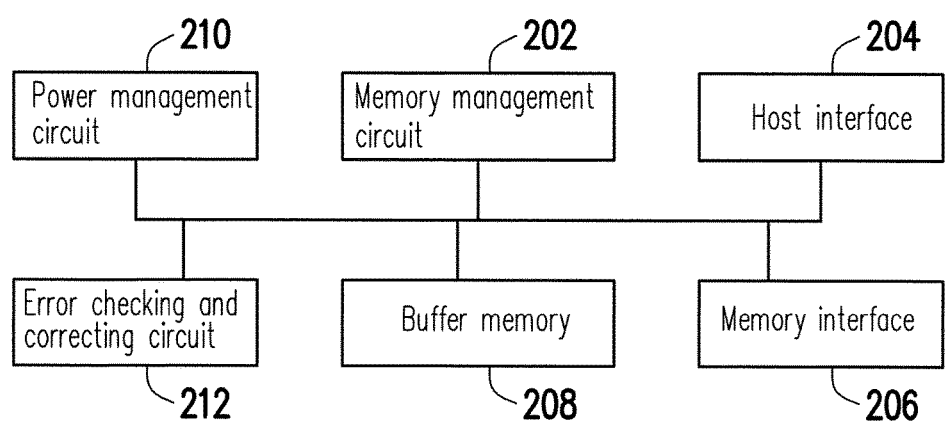
FIG. 5 is a block diagram of a memory control circuit unit according to an exemplary embodiment of the invention.

FIG. 5 is a block diagram of a memory control circuit unit according to an exemplary embodiment of the invention.

Referring to FIG. 5, the memory control circuit unit 404 includes the memory management circuit 202, the host interface 204 and the memory interface 206.

The memory management circuit 202 controls overall operation of the memory control circuit unit 404. Specifically, the memory management circuit 202 has a plurality of control commands, and when the memo storage device 10 is operated, the control commands are executed to perform data writing, reading and erasing operations. The following paragraphs describe that operation of the memory management circuit 202 or any circuitry element included in the memory control circuit unit 404 is equivalent to operation of the memory control circuit unit 404.

In the exemplary embodiment, the control command of the memory management circuit 202 is realized in the form of firmware. For example, the memory management circuit 202 has a microprocessor unit (not shown) and a read only memory (not shown). Moreover, the control commands are programmed into the read only memory. When the memory storage device 10 is operated, the control commands are executed by the microprocessor unit to perform data writing, reading and erasing operations.

In an exemplary embodiment of the invention, the control command of the memory management circuit 202 may be stored in a specific area (e.g., a system area in the memory module exclusively for storing system data) of the rewritable non-volatile memory module 406 in the form of a program code. In addition, the memory management circuit 202 has a microprocessor unit (not shown), a ROM (not shown) and an RAM (not shown). In particular, the ROM has a driving code, and when the memory control circuit unit 404 is enabled, the microprocessor unit executes the driving code segment first to load the control command stored in the rewritable non-volatile memory module 406 to the RAM of the memory management circuit 202. Thereafter, the microprocessor unit operates the control commands to perform data writing, reading and erasing operations.

Furthermore, in another exemplary embodiment of the invention, the control command of the memory management circuit 202 may be realized in the form of hardware. For example, the memory management circuit 202 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. Specifically, the memory cell management circuit manages the physical erasing unit of the rewritable non-volatile memory module 406; the memory writing circuit gives a write command to the rewritable non-volatile memory module 406 to write data to the rewritable non-volatile memory module 406; the memory reading circuit gives a read command to the rewritable non-volatile memory module 406 to read data from the rewritable non-volatile memory module 406; the memory erasing circuit gives an erase command to the rewritable non-volatile memory module 406 to erase data from the rewritable non-volatile memory module 406; and the data processing circuit processes the data to be written to the rewritable non-volatile memory module 406 and the data read from the rewritable non-volatile memory module 406.

The host interface 204 is coupled to the memory management circuit 202, receiving and identifying the command and data transmitted by the host system 11. In other words, the command and data transmitted by the host system 11 is transmitted to the memory management circuit 202 via the host interface 204. In the exemplary embodiment, the host interface 204 is compatible with SATA standard; however, it should be understood that the invention is not limited thereto. The host interface 204 may be compatible with PATA standard, IEEE 1394 standard, PCI Express standard, USB standard, UHS-I interface standard, UHS-II interface standard, SD standard, MS standard, MMC standard, CF standard, IDE standard or other suitable data transmission standard.

The memory interface 206 is coupled to the memory management circuit 202 and accesses the rewritable non-volatile memory module 406. In other words, the data to be written to the rewritable non-volatile memory module 406 is converted by the memory interface 206 to be a format that can be accepted by the rewritable non-volatile memory module 406.

In an exemplary embodiment of the invention, the memory control circuit unit 404 further includes the buffer memory 208, a power management circuit 210 and an error checking and correcting circuit 212.

The buffer memory 208 is coupled to the memory management circuit 202 and temporarily stores data and command from the host system 11 or data from the rewritable non-volatile memory module 406. In one embodiment, the buffer memory 208 is further configured to store the physical address-logical address mapping table. The physical address-logical address mapping table records the mapping information between the physical programming unit in an actuating physical erasing unit of the physical erasing unit and a plurality of updated logical addressees in the logical address. Specifically, when the host system 11 is to write updated data to the rewritable non-volatile memory module 406, the memory management circuit 202 gives command sequence to the rewritable non-volatile memory module 406, stores the updated data to one actuating physical erasing unit in the free area of the rewritable non-volatile memory module 406 according to the command sequence by using the control circuit of the rewritable non-volatile memory module 406, and records the mapping information between the logical page regarding the writing operation and the physical programming unit for storing the updated data in the actuating physical erasing unit in the physical address-logical address mapping table. Thereafter, the memory management circuit 202 may load a corresponding logical address-physical address mapping table from the rewritable non-volatile memory module 406 according to the physical address-logical address mapping table to update the mapping information of the logical address-physical address mapping table.

The power management circuit 210 is coupled to the memory management circuit 202 and configured to control power of the memory storage device 10.

The error checking and correcting circuit 212 is coupled to the memory management circuit 202 and configured to perform error checking and correcting procedure to ensure accuracy of data. Specifically, when the memory management circuit 202 receives the write command from the host system 11, the error checking and correcting circuit 212 generates a corresponding error checking and correcting code (ECC code) in corresponding to the write command, and the memory management circuit 202 writes the data corresponding to the write command and the corresponding error checking and correcting code to the rewritable non-volatile memory module 406. Thereafter, when reading data from the rewritable non-volatile memory module 406, the memory management circuit 202 simultaneously reads the error checking and correcting cod corresponding to the data, and the error checking and correcting circuit 212 performs the error checking and correcting procedure on the read data according to the ECC code.

Figure 6:
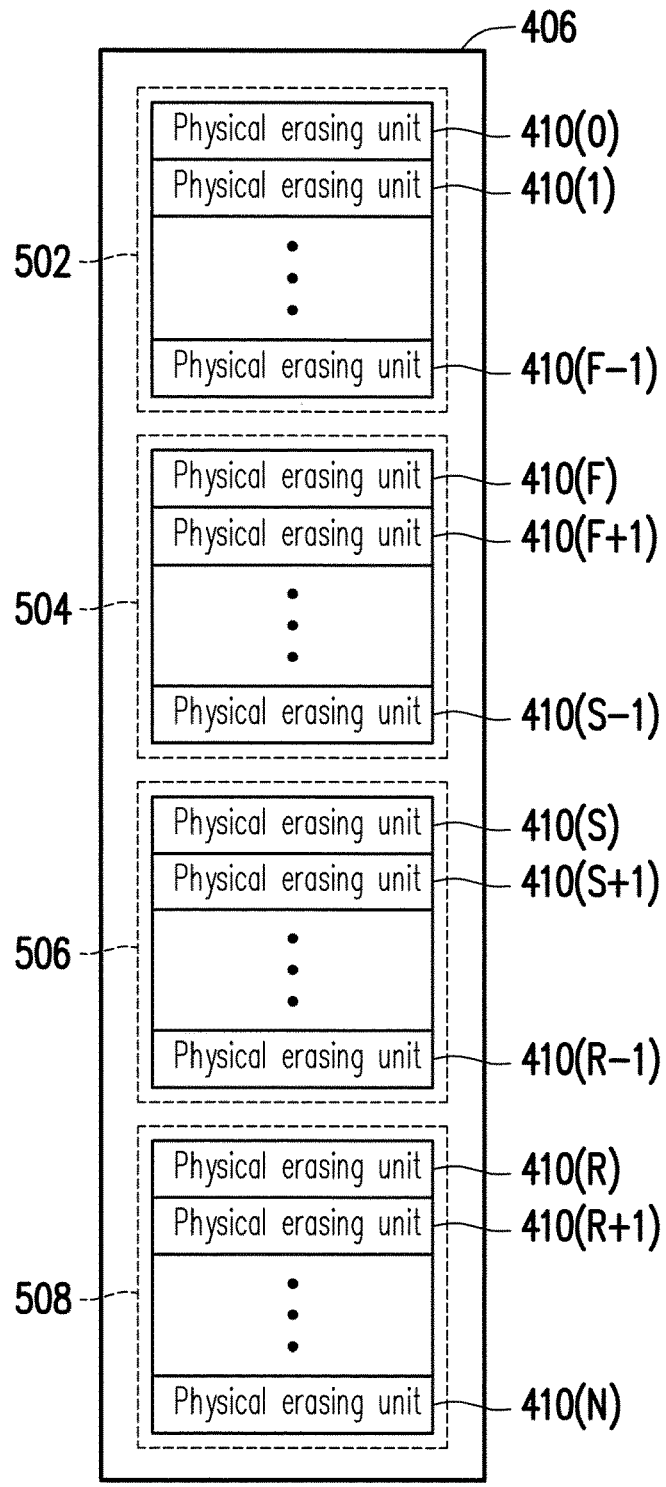
FIG. 6 and FIG. 7 are exemplary schematic views of a management physical erasing unit according to an exemplary embodiment.
Figure 7:
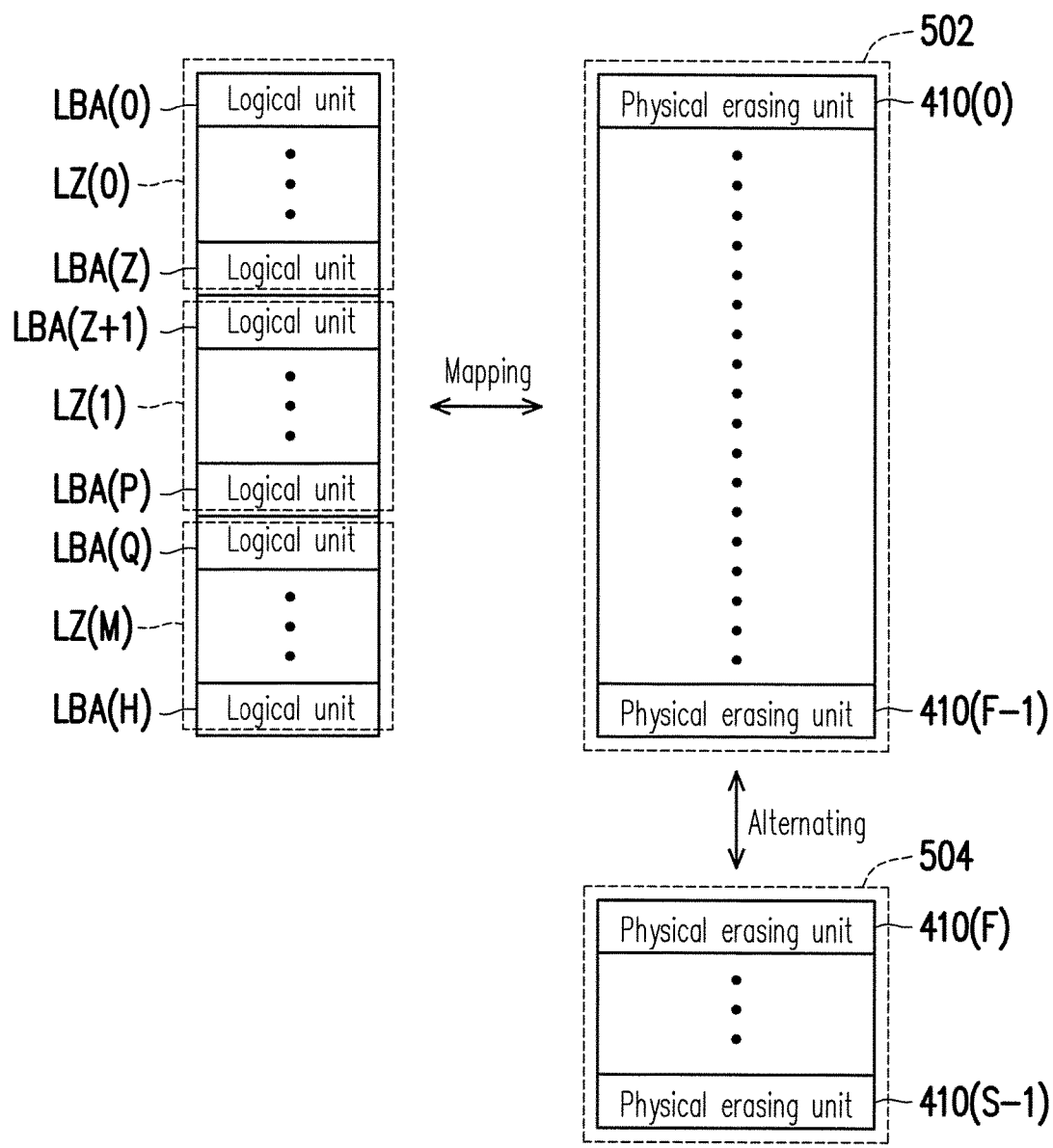

FIG. 6 and FIG. 7 are exemplary schematic views of a management physical erasing unit according to an exemplary embodiment.

Referring to FIG. 6, it is assumed that the rewritable non-volatile memory module 406 has physical erasing units 410(0)-410(N). The memory management circuit 202 logically divides the physical erasing units 410(0)-410(N) into a data area 502, a spare area 504, a system area 506 and a replacement area 508.

The physical erasing unit that logically belongs to the data area 502 and the spare area 504 is configured to store the data from the host system 11. Specifically, the physical erasing unit in the data area 502 is regarded as the physical easing unit that already stores data, and the physical easing unit in the spare area 504 is configured to replace the physical erasing unit in the data area 502. In other words, when receiving the write command and the data to be written from the host system 11, the memory management circuit 202 retrieves the physical erasing unit from the spare area 504, and writes the data to the retrieved physical erasing unit to replace the physical erasing unit in the date area 502.

The physical easing unit that logically belongs to the system area 506 is configured to record the system data. For example, the system data includes the manufacturer and model number regarding the rewritable non-volatile memory module, the number of the physical erasing unit of the rewritable non-volatile memory module and the number of physical programming unit of each of the physical erasing unit and so on.

The physical erasing unit that logically belongs to the replacement area 508 is used in a replacement procedure for bad physical erasing unit to replace the damaged physical erasing unit. Specifically, if there is still normal physical erasing unit in the replacement area 508 and the physical erasing unit in the data area 502 is damaged, the memory management circuit 202 retrieves the normal physical erasing unit from the replacement area 508 to replace the damaged physical erasing unit.

In particular, the number of the physical erasing unit in the data area 502, the spare area 504, the system area 506 and the replacement area 508 varies according to the specification of different memories. In addition, it should be understood that, in the operation of the memory storage device 10, the dividing relationship of the physical erasing unit associated to the data area 502, the spare area 504, the system area 506 and the replacement area 508 is changed dynamically. For example, when the physical erasing unit in the spare area 504 is damaged and replaced by the physical erasing unit of the replacement area 508, the physical erasing unit originally in the replacement area 508 is associated to the spare area 504.

Referring to FIG. 7, the memory management circuit 202 is provided with logical units LBA(0)-LBA(H) to map the physical erasing unit in the data area 502, wherein each of the logical units has a plurality of logical pages to map the physical programming unit corresponding to the physical erasing unit. Meanwhile, when the host system 100 is to write data to the logical unit or update the data stored in the logical unit, the memory management circuit 202 retrieves one physical erasing unit from the spare area 504 as the actuating physical erasing unit to be used for writing data to alternate the physical erasing unit in the data area 502.

In order to identify the physical erasing unit in which the data of each of the logical units is stored, in the exemplary embodiment, the memory management circuit 202 records the mapping relationship between the logical unit and the physical erasing unit. Moreover, when the host system 11 is to access data in the logical page, the memory management circuit 202 determines the logical unit to which the logical page belongs, and access data in the physical erasing unit mapped by the logical unit. For example, in the exemplary embodiment, the memory management circuit 202 stores the logical address-physical address mapping table in the rewritable non-volatile memory module 406 to record the physical erasing unit mapped by each of the logical units, and when the memory management circuit 202 is to access data, the memory management circuit 202 loads the logical address-physical address mapping table to the buffer memory 208 for maintenance.

It should be mentioned that, since the capacity of the buffer memory 208 is limited and cannot store the mapping table that records the mapping relationship of all logical units, in the exemplary embodiment, the memory management circuit 202 divides the logical units LBA(0)-LBA(H) into a plurality of logical zones LZ(0)-LZ(M), and each of the logical zones is provided with a logical address-physical address mapping table. In particular, when the memory management circuit 202 is to update the mapping information of a certain logical unit, the logical address-physical address mapping table corresponding to the logical zone to which the logical unit belongs is loaded to the buffer memory 208 to be updated. In the exemplary embodiment, the space required for storing all of the logical address-physical address mapping tables corresponds to one-thousandth of the space for storing the data in the rewritable non-volatile memory module 406. In other words, assuming that the capacity of the rewritable non-volatile memory module 406 is 1 TB(Terabyte), the space required for storing all of the logical address-physical address mapping tables is 1 GB(Gigabyte). However, in other exemplary embodiment, the space required for storing all of the logical address-physical address mapping tables may vary according to the capacity of the rewritable non-volatile memory module 406.

In the exemplary embodiment, when the host system 11 is to perform writing operation, the host system 11 may give a write command. The memory management circuit 202 retrieves one actuating physical erasing unit from the spare area 504, and writes the data (which is also referred to as updated data) in the write command from the host system 11 to the actuating physical erasing unit.

Specifically, when the memory storage device 10 receives the write command from the host system 11, the data in the write command from the host system 11 may be written in to one actuating physical erasing unit in the spare area 504. Moreover, when the physical erasing unit is written to the full, the memory management circuit 202 retrieves an empty physical erasing unit in the spare area 504 to be used as another actuating physical erasing unit to continue to write the updated data corresponding to the write command from the host system 11.

It is noted that in the following description, some terms may be replaced with corresponding abbreviations for ease of reading (see Table 1).

TABLE 1

| rewritable non-volatile memory module | RNVM module |
|---|---|
| physical erasing unit | PEU |
| physical programming unit | PPU |
| MMC | MMC |
| logical address-physical address mapping table | L2P table |
| physical address-logical address mapping table | P2L table |

Figure 8:
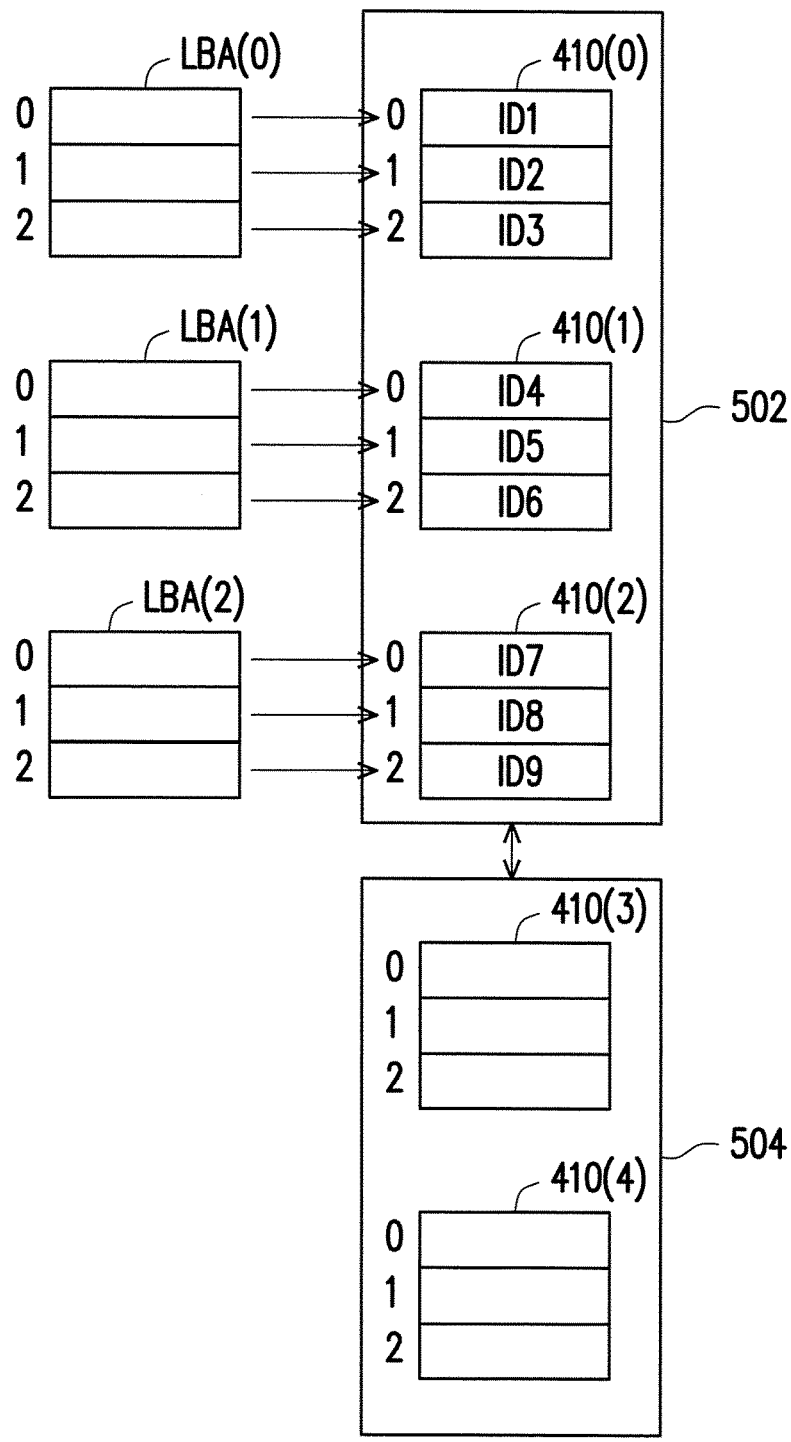
FIG. 8 to FIG. 10 are simplified examples illustrating updating a logical address-physical address mapping table according to an embodiment of the invention.
Figure 9:
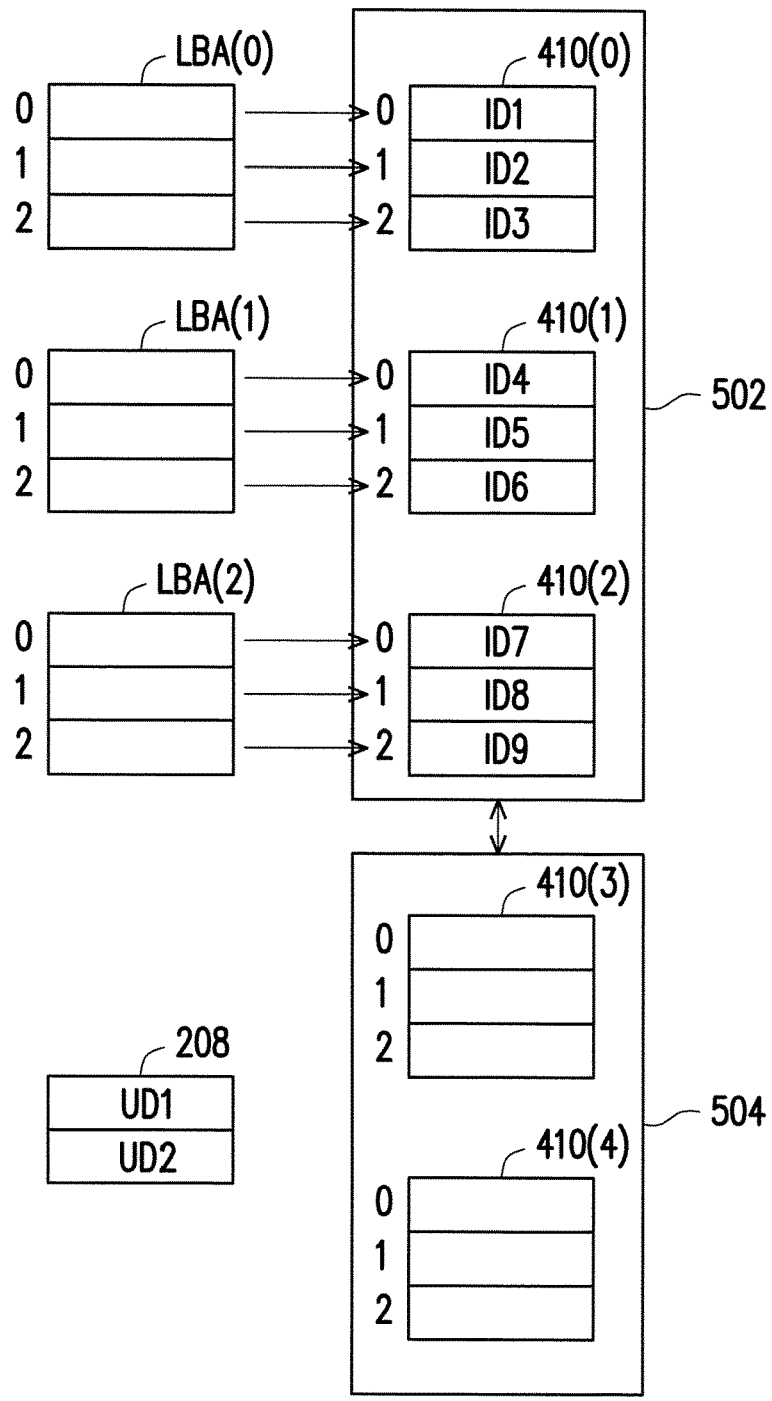
Figure 10:
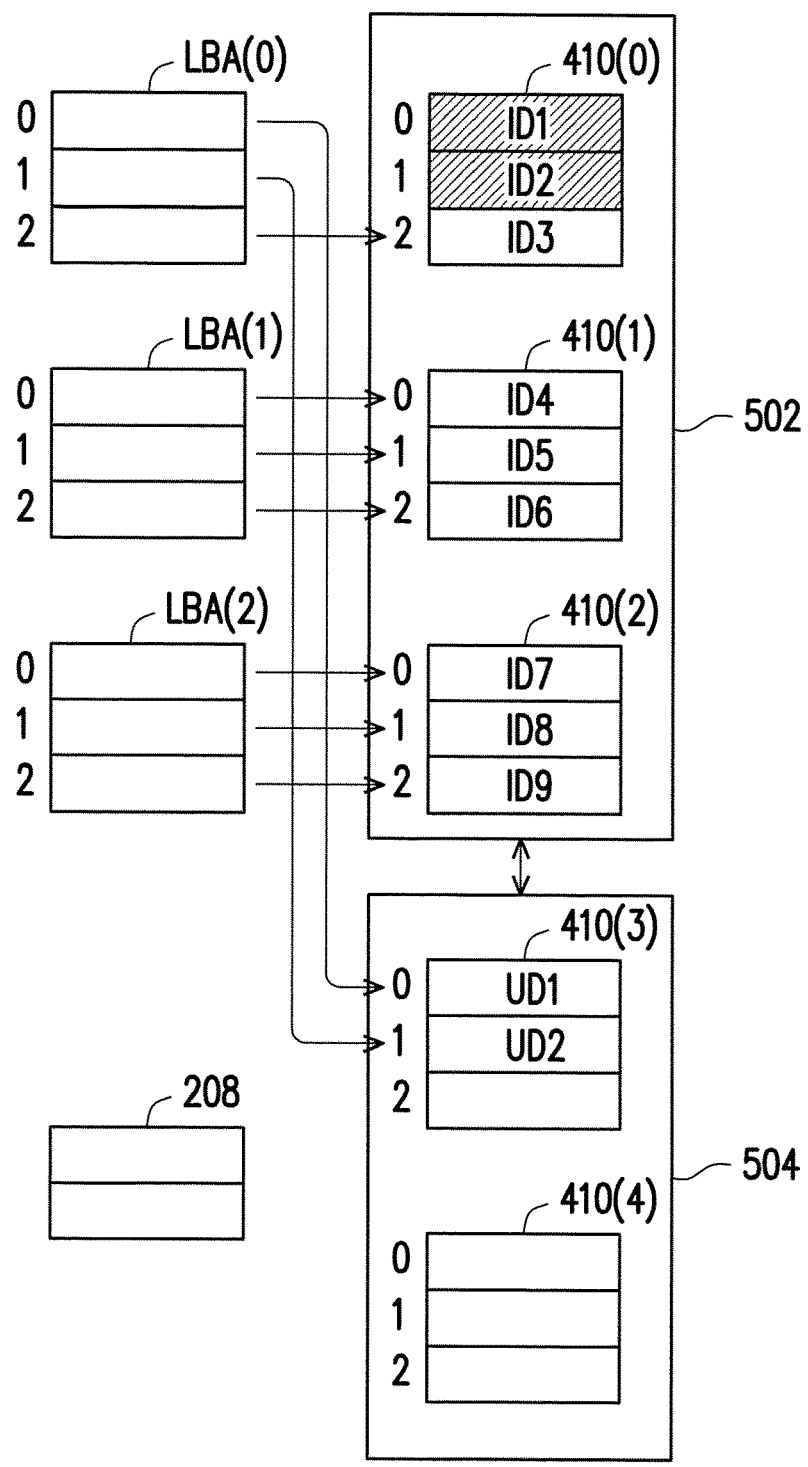

FIG. 8 to FIG. 10 are simplified examples illustrating updating a L2P table according to an embodiment of the invention.

For ease of description, it is assumed here that the data area 505 has three PEUs which are PEUs 410(0)-410(2) respectively, and the spare area 504 has two PEUs which are PEUs 410(3)-410(4) respectively. Each of the PEUs has three PPUs.

Referring to FIG. 8, it is assumed that, in the state of the memory storage device 10 of FIG. 8, the logical page of the logical units LBA(0)-LBA(2) maps the PPU of the PEUs 410(0)-410(2) in the data area 502, and the spare area 504 has PEUs 410(3)-410(4). In other words, the MMC 202 records the mapping relationship between the logical units LBA(0)-LBA(2) and the PEUs 410(0)-410(4) in the L2P table, and regards that the PPU of the PEUs 410(0)-410(2) already stores the data (i.e., initial data ID1-ID9) of the logical page which belongs to the logical units LBA(0)-LBA(2). In particular, in the exemplary embodiment, assuming the $0^{th}$-$2^{nd}$ logical pages of the current logical unit LBA(0) are respectively mapped to the $0^{th}$-$2^{nd}$ PPUs of the PEU 410(0), the $0^{th}$-$2^{nd}$ logical pages of the logical unit LBA(1) are respectively mapped to the $0^{th}$-$2^{nd}$ PPUs of the PEU 410(1), and the $0^{th}$-$2^{nd}$ logical pages of the logical unit LBA(2) are respectively mapped to the $0^{th}$-$2^{nd}$ PPUs of the PEU 410(2). In addition, the MMC 202 records to the usable PEUs 410(3)-410(4) in the spare area 504. Furthermore, when the host system 11 performs writing operating, in a conventional method, the MMC 202 records the mapping information of the updated data corresponding to the writing operation into a P2L table in the buffer memory 208.

It should be noted that, in the conventional method, when the host system 11 performs writing operation regarding a logical page, the MMC 202 gives a write command sequence to the RNVM module 406. The control circuit in the RNVM module 406 writes the updated data corresponding to the writing operation to the actuating PEU selected from the spare area 504. In the meantime, the MMC 202 does not immediately change the mapping relationship between the logical units LBA(0)-LBA(2) in the L2P table and the PEUs 410(0)-410(4). The MMC 202 records the address (i.e., physical address) of the PPU for storing the updated data in the actuating PEU along with the address (i.e., logical address) of the logical page corresponding to the writing operation into the P2L table in the buffer memory 208. When the P2L table is fully written, the corresponding L2P table is loaded to the buffer memory 208 according to the mapping information (i.e., the logical address corresponding to updated data) in the P2L table. Furthermore, after the mapping relationship between the logical units LBA(0)-LBA(2) and the PEUs 410(0)-410(4) is updated, the updated L2P table is stored back to the RNVM module 406. It should be mentioned that when the memory storage device 10 is in an idle state for a period of time (i.e., no command is received from the host system 11 for 30 seconds), the MMC 202 may load the corresponding L2P table to the buffer memory 208 according to the mapping information in the P2L table and, after the mapping relationship between the logical units LBA(0)-LBA(2) and the PEUs 410(0)-410 (4) is updated, stores the updated L2P table back to the RNVM module 406.

In other words, in the conventional method of updating the mapping information in the L2P table, generally the following three steps are performed in sequence: loading the L2P table to the buffer memory 208; updating the mapping information in the L2P table; and storing the updated L2P table back to the RNVM module 406.

However, in the above-mentioned process of updating the mapping information in the L2P table, since the MMC 202 is updating the mapping information in the L2P table, the RNVM module 406 general does not receive the command sequence given from the MMC 202. In other words, in the process of updating the mapping information in the L2P table, the control circuit of the RNVM module 406 is in an idle state, which causes that the utility of the RNVM module 406 is low. In particular, when the host system 11 gives a large amount of write command to the MMC 202, if the mapping information in the L2P table needs to be updated frequently in the writing operation, the utility of the RNVM module 406 will be low in the process of updating the mapping information in the L2P table, and the performance of the RNVM module 406 will be decreased in writing operation.

Therefore, the invention provides a mapping table updating method, which is capable of pre-loading the L2P table to the buffer memory 208. Moreover, when the control circuit of the RNVM module 406 writes data to the PPU, the MMC 202 can update the L2P table that is temporarily stored in the buffer memory 208. That is to say, the mapping table updating method provided by the invention enables the MMC 202 and the control circuit of the RNVM module 406 to work in parallels, thereby avoiding that the control circuit of the RNVM module 406 is in an idle state in the process that the MMC 202 updates the mapping information in the L2P table. In this manner, the method for updating the L2P table provided by the invention is capable of effectively increasing utility of the rewritable non-volatile memory module 406, thereby improving the performance of the RNVM module 406 in writing operation.

FIG. 9 to FIG. 10 are incorporated below to describe the mapping table updating method of the invention.

Referring to FIG. 9, in continuation of FIG. 8, it is assumed that the host system 11 is to write an updated data UD1 (which is also referred to as first data) to the RNVM module 406. The updated data UD1 belongs to the $0^{th}$ logical page of the logical unit LBA(0). Here, the address of the $0^{th}$ logical page of the logical unit LBA(0) is referred to as "a first logical address". At this time, the host system 11 may give a write command (which is also referred to as first write command) corresponding to the updated data UD1 to the MMC 202. When the MMC 202 receives the first write command, the update data UD1 in the first write command may be temporarily stored in the buffer memory 208 first.

In addition, it is assumed that the host system 11 is to write an updated data UD2 (which is also referred to as second data) to the RNVM module 406. The updated data UD2 belongs to the $1^{st}$ logical page of the logical unit LBA(0). Here, the address of the $1^{st}$ logical page of the logical unit LBA(0) is referred to as "a second logical address". At this time, the host system 11 may give a write command (which is also referred to as second write command) corresponding to the updated data UD2 to the MMC 202. When the MMC 202 receives the second write command, the updated data UD2 in the second write command may be temporarily stored in the buffer memory 208 first.

In particular, in the exemplary embodiment, it is assumed that the first write command and the second write command received by the MMC 202 are a plurality of continuous write commands received from the host system 11.

In the exemplary embodiment, when the MMC 202 receives a plurality of write commands from the host system 11, the MMC 202 determines whether to write the data of the write command to the RNVM module 406 based on a sequential write mode. Specifically, since the MMC 202 continuously receives the first write command and the second write command from the host system 11, the MMC 202 can determine whether the first logical address corresponding to the first data in the first write command and the second logical address corresponding to the second data in the second write command are continuous. In the exemplary embodiment, since the first logical address (i.e., the address of the $0^{th}$ logical page of the logical unit LBA(0)) and the second logical address (i.e., the address of the $1^{st}$ logical page of the logical unit LBA(0)) are continuous, the MMC 202 determines that the updated data UD1 and the updated data UD2 are written to the RNVM module 406 based on the sequential write mode. Furthermore, in an exemplary embodiment, when the first logical address and the second logical address are not continuous, the MMC 202 can, for example, determine that the updated data UD1 and the updated UD2 are written to the RNVM module 406 based on a random write mode.

When the MMC 202 determines that the updated data UD1 and the updated UD2 are written to the RNVM module 406 based on the sequential write mode, the MMC 202 can load the corresponding L2P table from the RNVM module 406 to the buffer memory 208 according to the address (or the address of the $1^{st}$ logical page of the logical unit LBA(0)) of the $0^{th}$ logical page of the logical unit LBA(0). That is to say, the MMC 202 correspondingly loads the L2P table (which is also referred to as first L2P table) of the logical unit LBA(0) from the RNVM module 406 to the buffer memory 208.

Next, referring to FIG. 10, the MMC 202 retrieves, for example, a PEU 410(3) from the spare area 504 as the actuating PEU, and gives the write command sequence to instruct the control circuit of the RNVM module 406 to write the updated data UD1 and the updated data UD2 to the $0^{th}$ PPU (which is also referred to as first PPU) of the PEU 410(3) and the first PPU (which is also referred to as second PPU) of the PEU 410(3) respectively.

In particular, when the control circuit of the RNVM module 406 write the updated data UD1 and the updated data UD2 to the $0^{th}$ PPU of the PEU 410(3) and the $1^{st}$ physical programming unit of the PEU 410(3) respectively, if the MMC 202 does not receive other command (i.e., the MMC 202 is in the idle state) from the host system 11, the MMC 202 may update the first L2P table temporarily stored in the buffer memory according to the first logical address in the first command and the $0^{th}$ PPU of the PEU 410(3), and update the first L2P table temporarily stored in the buffer memory according to the second logical address in the second command and the $1^{st}$ PPU of the PEU 410(3). Specifically, the MMC 202 updates the L2P table of the logical unit LBA(0) respectively to map the $0^{th}$ logical page of the logical unit LBA(0) to the $0^{th}$ PPU of the PEU 410(3) and the $1^{st}$ logical page of the logical unit LBA(0) to the $1^{st}$ PPU of the PEU 410(3).

When the control circuit of the RNVM module 406 writes the updated data UD1 and the updated data UD2 to the $0^{th}$ PPU of the PEU 410(3) and the $1^{st}$ PPU of the PEU 410(3) respectively, the MMC 202 stores the updated first L2P table from the buffer memory 208 back to the RNVM module 406. In the operation that the updated first L2P table is stored from the buffer memory 208 back to the RNVM module 406, the MMC 202 stops receiving the updated data corresponding to other logical address from the host system 11 and/or stop sending the command sequence to the RNVM module 406.

It should be indicated that the present exemplary embodiment provides no limitation to determination of the timing for performing writing based on the sequential write mode and the determination method therefor. In one exemplary embodiment, when the MMC 202 receives the first write command corresponding to the updated data UD1, the MMC 202 can directly assume that the updated data UD1 is written based on the sequential write mode, thereby performing the operation of loading the first L2P table. Additionally, in one exemplary embodiment, when the MMC 202 receives the first write command corresponding to the updated data UD1, the MMC 202 may not perform the operation of determining whether to perform writing operation based on the sequential write mode, and directly load the first L2P table for updating operation.

Figure 11:
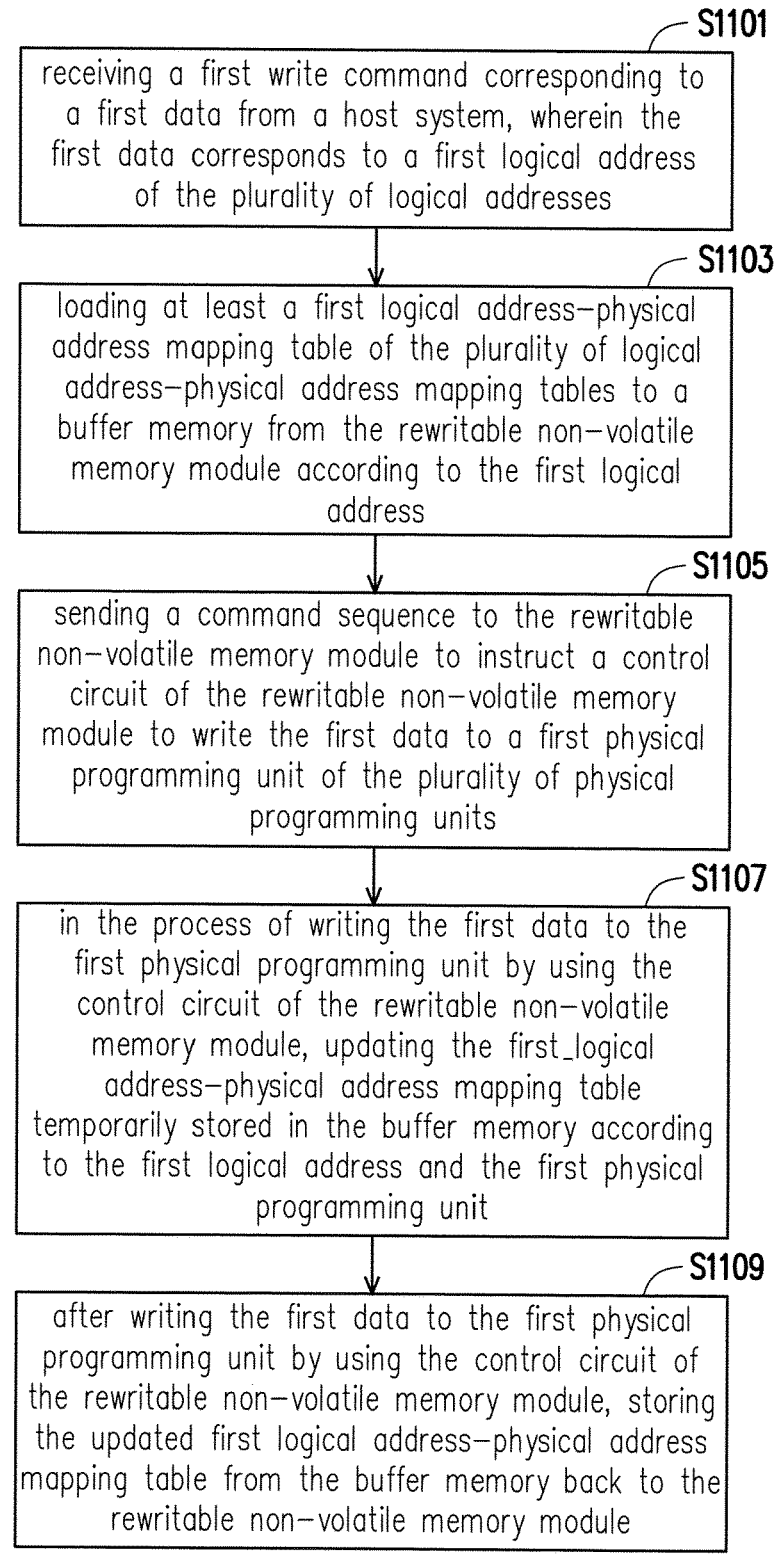
FIG. 11 is a flowchart of a mapping table updating method according to an exemplary embodiment.

In particular, in the mapping table updating method, when the updated data is written based on the sequential write mode, since the L2P table corresponding to the updated data is loaded to the buffer memory 208, when the control circuit of the RNVM module 406 writes the plurality of updated data to the PPU, the MMC 202 may update the plurality of mapping information temporarily stored in the L2P table of the buffer memory 208. In other words, under the sequential write mode, the mapping table updating method of the invention is capable of effectively enhancing the efficiency of updating the L2P table while effectively increasing utility of the RNVM module 406. FIG. 11 is a flowchart of a mapping table updating method according to an exemplary embodiment.

Referring to FIG. 11, in step S1101, the MMC 202 receives the first write command corresponding to the first data from the host system 11. The first data corresponds to the first logical address of the plurality of logical addresses. In step S1103, the MMC 202 loads the first L2P table of the plurality of L2P tables to the buffer memory 208 from the RNVM module 406 according to the first logical address. In step S1105, the MMC 202 sends the command sequence to the RNVM module 406 to instruct the control circuit of the RNVM module 406 to write the first data to the first PPU of the plurality of PPUs. In the process that the control circuit of the RNVM module 406 writes the first data to the first PPU, in step S1107, the MMC 202 updates the first L2P table temporarily stored in the buffer memory 208 according to the first logical address and the first PPU. After the control circuit of the RNVM module 406 writes the first data to the first PPU, in step S1109, the MMC 202 stores the updated first L2P table from the buffer memory 208 back to the RNVM module 406.

In summary, according to the invention, the mapping table updating method, the memory control circuit unit and the memory storage device can pre-load the L2P table to the buffer memory and, when the control circuit of the RNVM module writes data to the PPU, update the L2P table temporarily stored in the buffer memory. In this manner, it can be avoided that the RNVM module is in an idle state, thereby improving the utility of the RNVM module and enhancing the performance of the RNVM module in writing operation.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A mapping table updating method, adapted to a rewritable non-volatile memory module, wherein the rewritable non-volatile memory module has a plurality of physical erasing units, each of the plurality of physical erasing units has a plurality of physical programming units, a plurality of logical address-physical address mapping tables are stored in the rewritable non-volatile memory module to record a mapping information between a plurality of logical addresses and the plurality of physical programming units, the method comprising:
receiving a first write command corresponding to a first data from a host system, wherein the first data corresponds to a first logical address of the plurality of logical addresses;
loading at least a first logical address-physical address mapping table of the plurality of logical address-physical address mapping tables to a buffer memory from the rewritable non-volatile memory module according to the first logical address;
sending a command sequence to the rewritable non-volatile memory module to instruct a control circuit of the rewritable non-volatile memory module to write the first data to a first physical programming unit of the plurality of physical programming units;
in the process of writing the first data to the first physical programming unit by using the control circuit of the rewritable non-volatile memory module, updating the first logical address-physical address mapping table temporarily stored in the buffer memory according to the first logical address and the first physical programming unit; and
after writing the first data to the first physical programming unit by using the control circuit of the rewritable non-volatile memory module, storing the updated first logical address-physical address mapping table from the buffer memory back to the rewritable non-volatile memory module.

2. The mapping table updating method according to claim 1, further comprising:
determining whether the first data is written to the rewritable non-volatile memory module based on a sequential write mode; and
if the first data is written to the rewritable non-volatile memory module based on the sequential write mode, performing the step of loading the first logical address-physical address mapping table of the plurality of logical address-physical address mapping tables to the buffer memory from the rewritable non-volatile memory module according to the first logical address.

3. The mapping table updating method according to claim 2, further comprising:
receiving a second write command corresponding a second data from the host system, wherein the second data corresponds to a second logical address of the plurality of logical addresses, and the first write command and the second write command are plurality of continuous write commands received from the host system,
wherein the step of determining whether the first data is written to the rewritable non-volatile memory module based on the sequential write mode comprises:
determining whether first logical address and the second logical address are continuous; and
if the first logical address and the second logical address care continuous, determining that the first data is written to the rewritable non-volatile memory module based on the sequential write mode.

4. The mapping table updating method according to claim 3, wherein the command sequence is further configured to instruct the control circuit of the rewritable non-volatile memory module to write the second data to a second physical programming unit of the plurality of physical programming units,
wherein the step of updating the first logical address-physical address mapping table temporarily stored in the buffer memory according to the first logical address and the first physical programming unit comprises:
updating the first logical address-physical address mapping table temporarily stored in the buffer memory according to the second logical address and the second physical programming unit.

5. The mapping table updating method according to claim 1, wherein the step of updating the first logical address-physical address mapping table temporarily stored in the buffer memory according to the first logical address and the first physical programming unit comprises:
updating the mapping information in the first logical address-physical address mapping table temporarily stored in the buffer memory such that the first logical address is mapped to the first physical programming unit.

6. The mapping table updating method according to claim 1, wherein the step of storing the updated first logical address-physical address mapping table from the buffer memory back to the rewritable non-volatile memory module comprises:
stop receiving a third data corresponding to a third logical address of the plurality of logical addresses from the host stem and/or stop sending another command sequence to the rewritable non-volatile memory module.

7. A memory control circuit unit, configured to control a rewritable non-volatile memory module, wherein the rewriteable non-volatile memory module has a plurality of physical erasing units, each of the plurality of physical easing units has a plurality of physical programming units, the plurality of logical address-physical address mapping tables are stored in the rewritable non-volatile memory module to record a mapping information between a plurality of logical addresses and the plurality of physical programming units, the memory control circuit unit comprising:

a host interface, coupled to a host system;
a memory interface, coupled to the rewritable non-volatile memory module;
a memory management circuit, coupled to the host interface and the memory interface,
wherein the memory management circuit is configured to receive a first write command corresponding to a first data from the host system, wherein the first data corresponds to a first logical address of the plurality of logical addresses,
wherein the memory management circuit is further configured to load at least a first logical address-physical address mapping table of the plurality of logical address-physical address mapping tables to a buffer memory from the rewritable non-volatile memory module according to the first logical address,
wherein the memory management circuit is further configured to send a command sequence to the rewritable non-volatile memory module to instruct a control circuit of the rewritable non-volatile memory module to write the first data to a first physical programming unit of the plurality of physical programming units,
wherein in the process that the control circuit of the rewritable non-volatile memory module writes the first data to the first physical programming unit, the memory management circuit is further configured to update the first logical address-physical address mapping table temporarily stored in the buffer memory according to the first logical address and the first physical programming unit,
wherein after the control circuit of the rewritable non-volatile memory module writes the first data to the first physical programming unit, the memory management circuit is further configured to store the updated first logical address-physical address mapping table from the buffer memory back to the rewritable non-volatile memory module.

8. The memory control circuit unit according to claim 7, wherein
the memory management circuit determines whether the first data is written to the rewritable non-volatile memory module based on a sequential write mode, and
if the first data is written to the rewritable non-volatile memory module based on the sequential write mode, the memory management circuit performs the operation of loading the first logical address-physical address mapping table of the plurality of logical address-physical address mapping tables to the buffer memory from the rewritable non-volatile memory module according to the first logical address.

9. The memory control circuit unit according to claim 8, wherein
the memory management circuit receives a second write command corresponding to a second data from the host system, wherein the second data corresponds to a second logical address of the plurality of logical addresses, and the first write command and the second write command are plurality of continuous write commands received from the host system,
wherein in the operation of determining whether the first data is written to the rewritable non-volatile memory module based on the sequential write mode,
the memory management circuit determines whether the first logical address and the second logical address are continuous, and
if the first logical address and the second logical address are continuous, the memory management circuit determines that the first data is written to the rewritable non-volatile memory module based on the sequential write mode.

10. The memory control circuit unit according to claim 9, wherein the command sequence is further configured to instruct the control circuit of the rewritable non-volatile memory module to write the second data to a second physical programming unit of the plurality of physical programming units,
wherein in the operation of updating the first logical address-physical address mapping table temporarily stored in the buffer memory according to the first logical address and the first physical programming unit,
the memory management circuit updates the first logical address-physical address mapping table temporarily stored in the buffer memory according to the second logical address and the second physical programming unit.

11. The memory control circuit unit according to claim 7, wherein in the operation of updating the first logical address-physical address mapping table temporarily stored in the buffer memory according to the first logical address and the first physical programming unit,
the memory management circuit updates the mapping information in the first logical address-physical address mapping table temporally stored in the buffer memory such that the first logical address is mapped to the first physical programming unit.

12. The memory control circuit unit according to claim 7, wherein in the operation of storing the updated first logical address-physical address mapping table from the buffer memory back to the rewritable non-volatile memory module,
the memory management circuit stops receive a third data corresponding to a third logical address of the plurality of logical addresses from the host system and/or stop sending another command sequence to the rewritable non-volatile memory module.

13. A memory storage device, comprising:
a connection interface unit, coupled to a host system;
a rewritable non-volatile memory module, having a plurality of physical erasing units, each of the plurality of physical erasing units having a plurality of physical programming units, a plurality of logical address-physical address mapping tables stored in the rewritable non-volatile memory module to record a mapping information between a plurality of logical addresses and the plurality of physical programming units; and
a memory control circuit unit, coupled to the connection interface unit and the rewritable non-volatile memory module,
wherein the memory control circuit unit is configured to receive a first write command corresponding to a first data from the host system, wherein the first data corresponds to a first logical address of the plurality of the logical addresses, wherein the memory control circuit unit is further configured to load at least a first logical address-physical address mapping table of the plurality of logical address-physical address mapping tables to a buffer memory from the rewritable non-volatile memory module according to the first logical address, wherein the memory control circuit unit is further configured to send a command sequence to the rewritable non-volatile memory module to instruct a control circuit of the rewritable non-volatile memory module to write the first data to a first physical programming unit of the plurality of physical programming units, wherein in the process of writing the first data to the first physical programming unit by using the control circuit of the rewritable non-volatile memory module, the memory control circuit unit is further configured to update the first logical address-physical addresses mapping table temporarily stored in the buffer memory according to the first logical address and the first physical programming unit, wherein after the control circuit of the rewritable non-volatile memory module writes the first data to the first physical programming unit, the memory control circuit unit is further configured to store the updated first logical address-physical address mapping table from the buffer memory back to the rewritable non-volatile memory module.

14. The memory storage device according to claim 13, wherein
the memory control circuit unit determines whether the first data is written to the rewritable non-volatile memory module based on a sequential write mode, and
if the first data is written to the rewritable non-volatile memory module based on the sequential write mode, the memory control circuit unit performs the operation of loading the first logical address-physical address mapping table of the plurality of logical address-physical address mapping tables to the buffer memory from the rewritable non-volatile memory module according to the first logical address.

15. The memory storage device according to claim 14, wherein
the memory control circuit unit receives a second write command corresponding to a second data from the host system, wherein the second data corresponds to a second logical address of the plurality of logical addresses, and the first write command and the second write command are plurality of continuous write commands received from the host system, wherein in the operation of determining whether the first data is written to the rewritable non-volatile memory module based on the sequential write mode,
the memory control circuit unit determines whether the first logical address and the second logical address are continuous, and
if the first logical address and the second logical address are continuous, the memory control circuit unit determines that the first data is written to the rewritable non-volatile memory module based on the sequential write mode.

16. The memory storage device according to claim 15, wherein the command sequence is further configured to instruct the control circuit of the rewritable non-volatile memory module to write the second data to a second physical programming unit of the plurality of physical programming units,
wherein in the operation of updating the first logical address-physical address mapping table temporarily stored in the buffer memory according to the first logical address and the first physical programming unit,
the memory control circuit unit updates the first logical address-physical address mapping table temporarily stored in the buffer memory according to the second logical address and the second physical programming unit.

17. The memory storage device according to claim 13, wherein in the operation of updating the first logical address-physical address mapping table temporarily stored in the buffer memory according to the first logical address and the first physical programming unit,
the memory control circuit unit updates the mapping information in the first logical address-physical address mapping table temporarily stored in the buffer memory such that the first logical address is mapped to the first physical programming unit.

18. The memory storage device according to claim 13, wherein in the operation of storing the updated first logical address-physical address mapping table from the buffer memory back to the rewritable non-volatile memory module,
the memory control circuit unit stops receiving a third data corresponding to a third logical address of the plurality of logical addresses from the host system and/or stops sending another command sequence to the rewritable non-volatile memory module.

* * * * *